United States Patent
Nian et al.

(10) Patent No.: US 8,610,230 B1
(45) Date of Patent: Dec. 17, 2013

(54) HFO$_2$/SIO$_2$-SI INTERFACE IMPROVEMENT FOR CMOS IMAGE SENSOR

(71) Applicant: Taiwan Semiconductor Manfacturing Company, Ltd., Hsin-Chu (TW)

(72) Inventors: Jun-Nan Nian, Tainan (TW);
Shih-Chieh Chang, Taipei (TW);
Chi-Cherng Jeng, Tainan County (TW);
Shiu-Ko JangJian, Tainan (TW); Yu-Te Hung, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/666,783

(22) Filed: Nov. 1, 2012

(51) Int. Cl.
*H01L 27/14* (2006.01)

(52) U.S. Cl.
USPC ............... 257/437; 438/72; 257/E27.133

(58) Field of Classification Search
USPC ............... 257/437, E27.133; 438/72
See application file for complete search history.

(56) References Cited

U.S. PATENT DOCUMENTS 8,405,016 B2 * 3/2013 Oshiyama et al. ......... 250/208.1
2011/0241148 A1 * 10/2011 Hiyama et al. ............... 257/435

* cited by examiner

*Primary Examiner* — Trung Q Dang
(74) *Attorney, Agent, or Firm* — Slater & Matsil, L.L.P.

(57) ABSTRACT

A semiconductor device including a substrate and an anti-reflective coating disposed upon the substrate, the anti-reflective coating and the substrate forming an interface, a carbon concentration and a chlorine concentration less than an oxygen concentration at the interface.

20 Claims, 5 Drawing Sheets

| Tool type | Precursor | [Cl] and [C] vs. [O] at $HfO_2/SiO_2$ -Si interface | Array DC (e/s) | DINU fail rate | Bubble defect |
|---|---|---|---|---|---|
| AMAT-ALD | $HfCl_4 + H_2O$ | [C] < [O], [Cl] > [O] | 6.4 | 0% | NG |
| AMAT-MOCVD | $TDEAH + O_2$ | [C] > [O], [Cl] < [O] | 147 | 86% | Free |
| TEL-ALD | $TDMAH + O_3$ | [C] < [O], [Cl] > [O] | 6 | 0.4% | Free |
| ASM-ALD | $HfCl_4 + H_2O$ | [C] < [O], [Cl] > [O] | 5.98 | 0% | NG |

Fig. 3

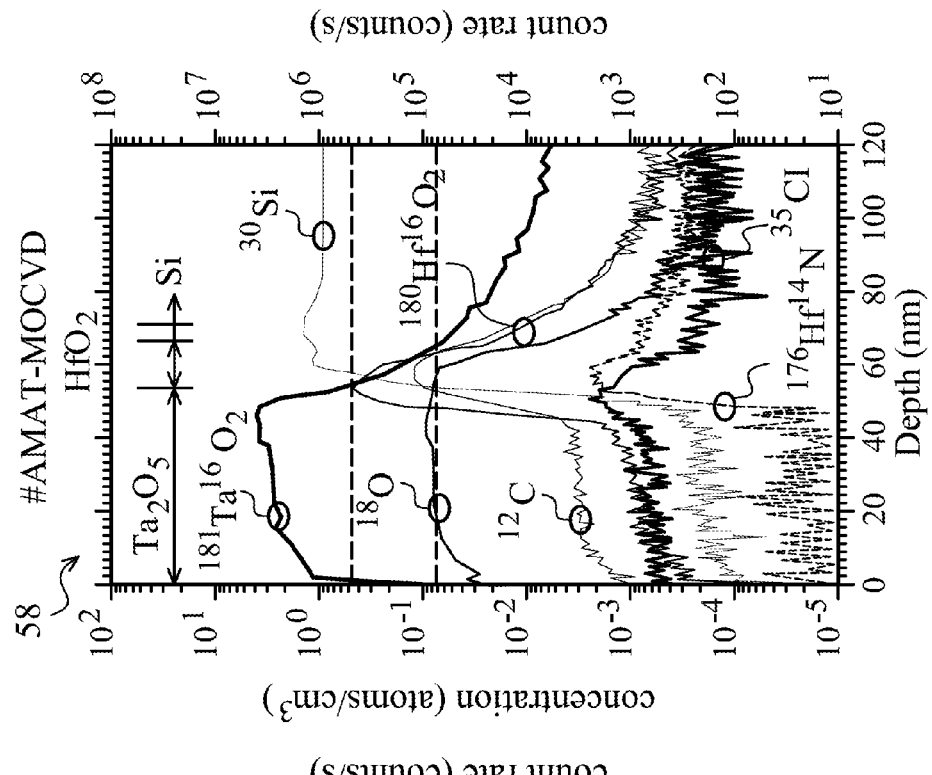
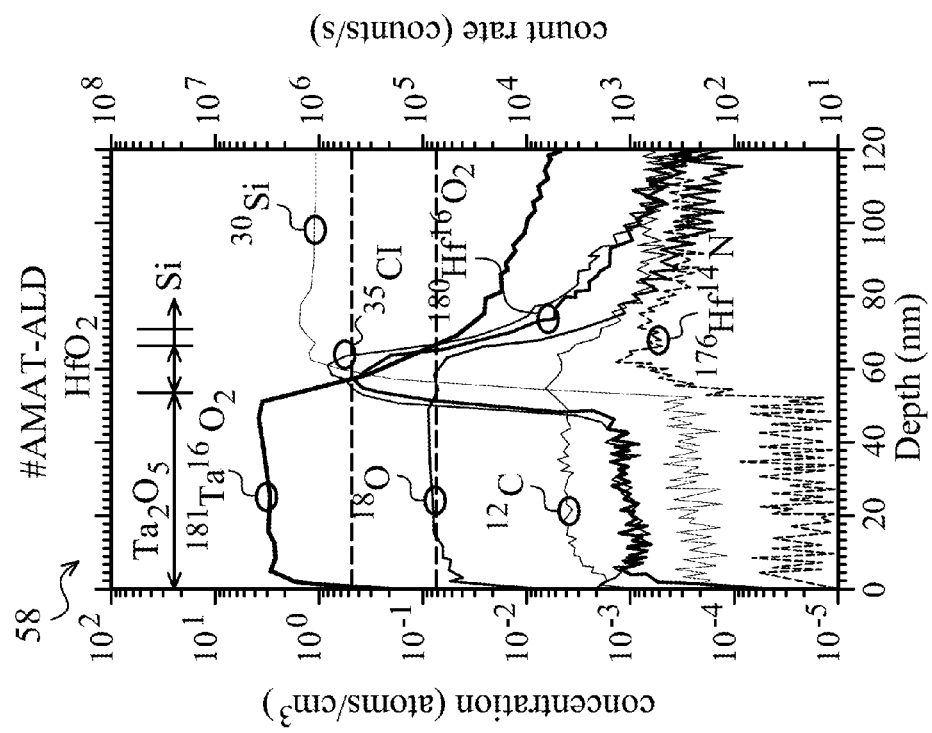
Fig. 4a
Fig. 4b

HFO₂/SIO₂-SI INTERFACE IMPROVEMENT FOR CMOS IMAGE SENSOR

BACKGROUND

A complementary metal-oxide-semiconductor (CMOS) image sensor (CIS) generally utilizes a series of photodiodes formed within an array of pixel regions of a semiconductor substrate in order to sense when light has impacted the photodiode. Adjacent to each of the photodiodes within each of the pixel regions, a transfer transistor may be formed in order to transfer the signal generated by the sensed light within the photodiode at a desired time. Such photodiodes and transfer transistors allow for an image to be captured at a desired time by operating the transfer transistor at the desired time.

The CIS may be formed in either a front side illumination (FSI) configuration or a back-side illumination (BSI) configuration. In a front-side illumination configuration, light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In the BSI configuration, the transfer transistor, the metal layers, and the dielectric layers are formed on the front side of the substrate and light is allowed to pass to the photodiode from the "back" side of the substrate. As such, the light hits the photodiode before reaching the transfer transistor, the dielectric layers, or the metal layers. Such a configuration may reduce the complexity of the manufacturing of the image sensor and improve the image sensor operation.

Unfortunately, the conventional CIS may be subject to an undesirable amount of bubble defects and/or dark currents (DC).

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3 is a chart listing various parameters, conditions, and test results pertaining to the interface between the anti-reflective coating (ARC) and the underlying substrate in the CIS of FIG. 1; and FIGS. 4a-4d are graphs illustrating an amount of carbon [C], chlorine [Cl], and oxygen [O] at the interface between the anti-reflective coating (ARC) and the underlying substrate in the CIS of FIG. 1 for different tool types and precursors.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a complementary metal-oxide-semiconductor (CMOS) image sensor (CIS). The concepts in the disclosure may also apply, however, to other semiconductor structures or circuits.

Figure 1:
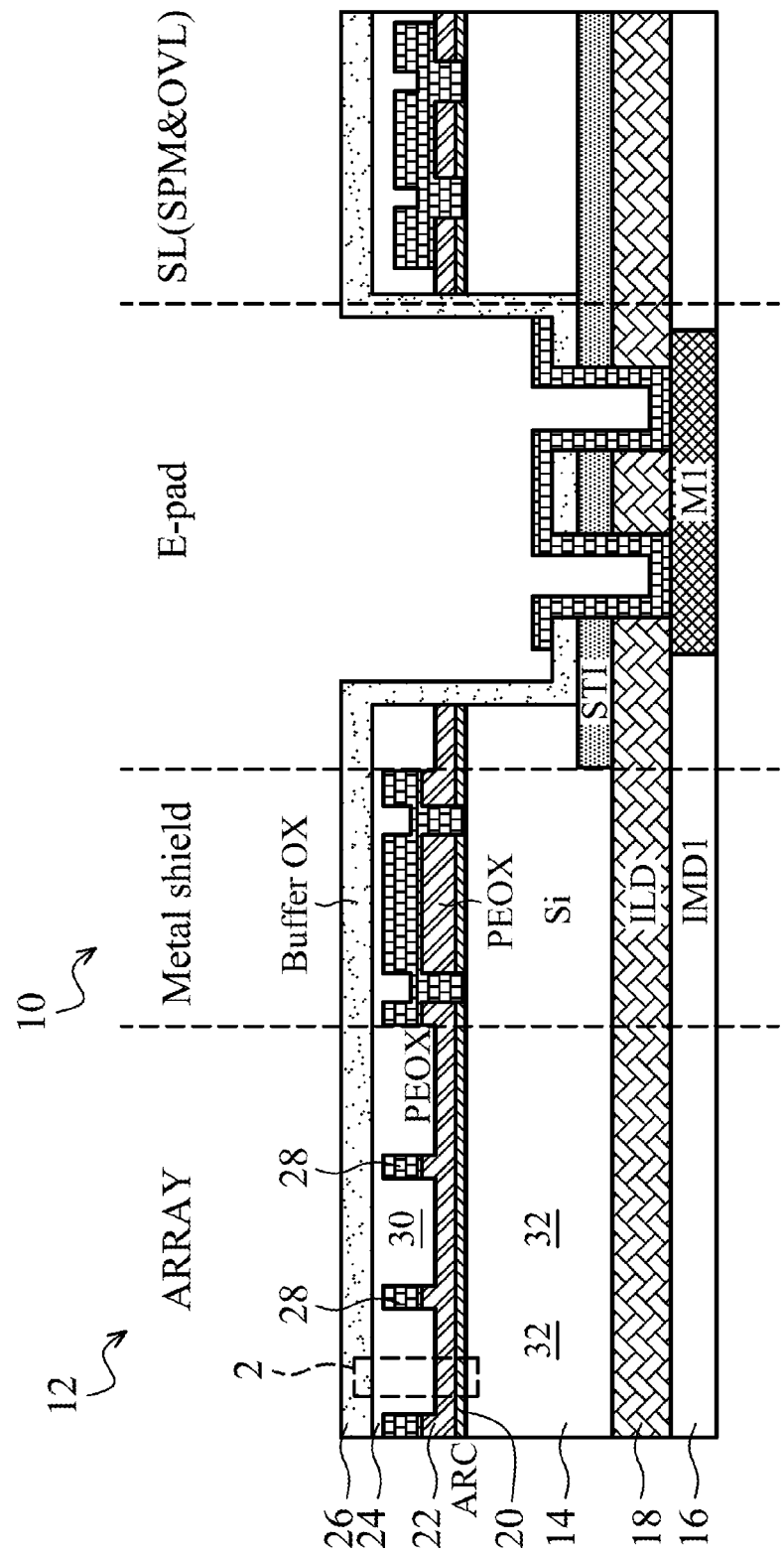
FIG. 1 is perspective view of a representative portion of an embodiment complementary metal-oxide-semiconductor (CMOS) image sensor (CIS)

Referring to FIG. 1, an embodiment complementary metal-oxide-semiconductor (CMOS) image sensor (CIS) 10 is illustrated. In an embodiment, the CIS 10 generally includes an array portion 12. As shown, the array portion 12 of the CIS 10 includes a substrate 14 overlying an intermetal dielectric 16 and an interlevel dielectric 18. The substrate 12 may be formed from, for example, silicon or a silicon-containing material (e.g., silicon germanium, etc.). While not described in detail herein, it should be recognized that the CIS 10 also includes other structures, features, and portions (e.g., the metal shield, the E-pad, the SL (SPM&OVL), etc.).

Still referring to FIG. 1, an anti-reflective coating (ARC) 20 is formed over the substrate 14 to reduce reflection of incident light. As shown, a first oxide 22, a second oxide 24, and a buffer oxide 26 are formed over the anti-reflective coating 20. In an embodiment, the first oxide 22 is a plasma enhanced oxide (PEOX) having a thickness of about 1100 Angstroms. In an embodiment, the second oxide 24 is a low deposited rate resistor protection oxide (LRPO) having a thickness of about 4200 Angstroms. In an embodiment, the buffer oxide 26 is a plasma enhanced oxide (PEOX) having a thickness of about 500 Angstroms. As such, in an embodiment the first oxide 22, the second oxide 24, and the buffer oxide 26 have a collective thickness of about 5800 Angstroms.

As shown, a grid 28 is included in the CIS 10. In an embodiment, the grid 28 is supported by the first oxide 22, embedded in the second oxide 24, and disposed beneath the buffer oxide 26. The grid 28 may be formed from a variety of suitable materials such as, for example, tungsten, aluminum, copper, an alloy or a composite. In an embodiment, the grid 28 is formed from a low refractive index material such as, for example, an oxide. As shown in FIG. 1, the grid 28 generally defines several cavities 30 which are disposed above pixel regions 32 in the substrate 14. The pixel regions 32 each support or incorporate a photodiode (not shown) and corresponding image sensor circuitry (e.g., transistor, etc.).

Figure 2:
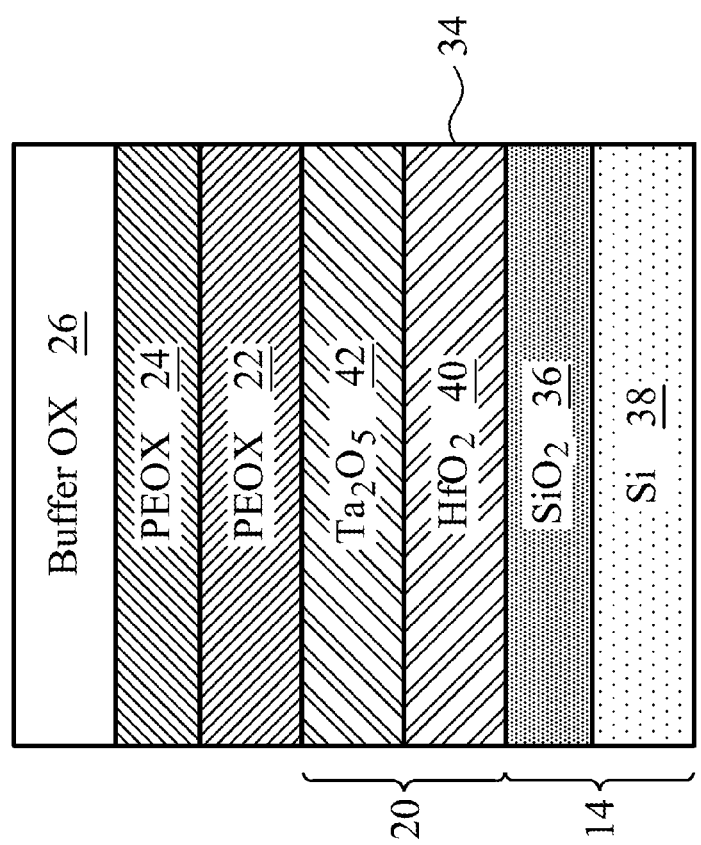
FIG. 2 is a cut-away portion of the CIS of FIG. 1 highlighting an interface between an anti-reflective coating (ARC) and an underlying substrate in the CIS of FIG. 1.

Referring now to FIG. 2, a cut-away portion of the CIS 10 in FIG. 1 illustrates an interface 34 between the substrate 14 and the anti-reflective coating 20 in further detail. In an embodiment, the interface 34 is between about 50 μm to about 60 μm below an upper surface of the anti-reflective coating 20. Even so, the interface 34 may be formed or disposed at other depths in other embodiments.

In an embodiment, the substrate 14 includes a thin layer of silicon dioxide ($SiO_2$) 36 formed on an underlying silicon 38 due to oxidation of the silicon 38. In an embodiment, the anti-reflective coating 20 is formed from a layer or film of hafnium oxide ($HfO_2$) 40 disposed on or over a layer or film of tantalum pentoxide ($Ta_2O_5$) 42. As shown, the first oxide 22, second oxide 24, and buffer oxide 26 are disposed over or on the tantalum pentoxide 42. It should be recognized that intervening layers may be present in other embodiments.

Referring now to FIG. 3, a chart 44 listing various parameters, conditions, and test results pertaining to the interface 34 between the anti-reflective coating 20 and the underlying substrate 14 of the CIS 10 have been collected. Indeed, the chart 44 includes a column for that identifies a tool type 46 and a precursor 48 used in the formation of the CIS 10 of FIG. 1. The chart 44 also illustrates an element concentration comparison 50 at the interface 34, an array dark current 52 in electrons per second (e/s), a dark image non-uniformity (DINU) fail rate 54 percentage, and a bubble defect 56 result.

In an embodiment, the element concentration used for the element concentration comparison 50 is determined using secondary ion mass spectrometry (SIMS). Secondary ion mass spectrometry is a technique used in materials science and surface science to analyze the composition of solid surfaces and thin films by sputtering the surface of the specimen with a focused primary ion beam and collecting and analyzing ejected secondary ions.

Figures 4C, 4D:
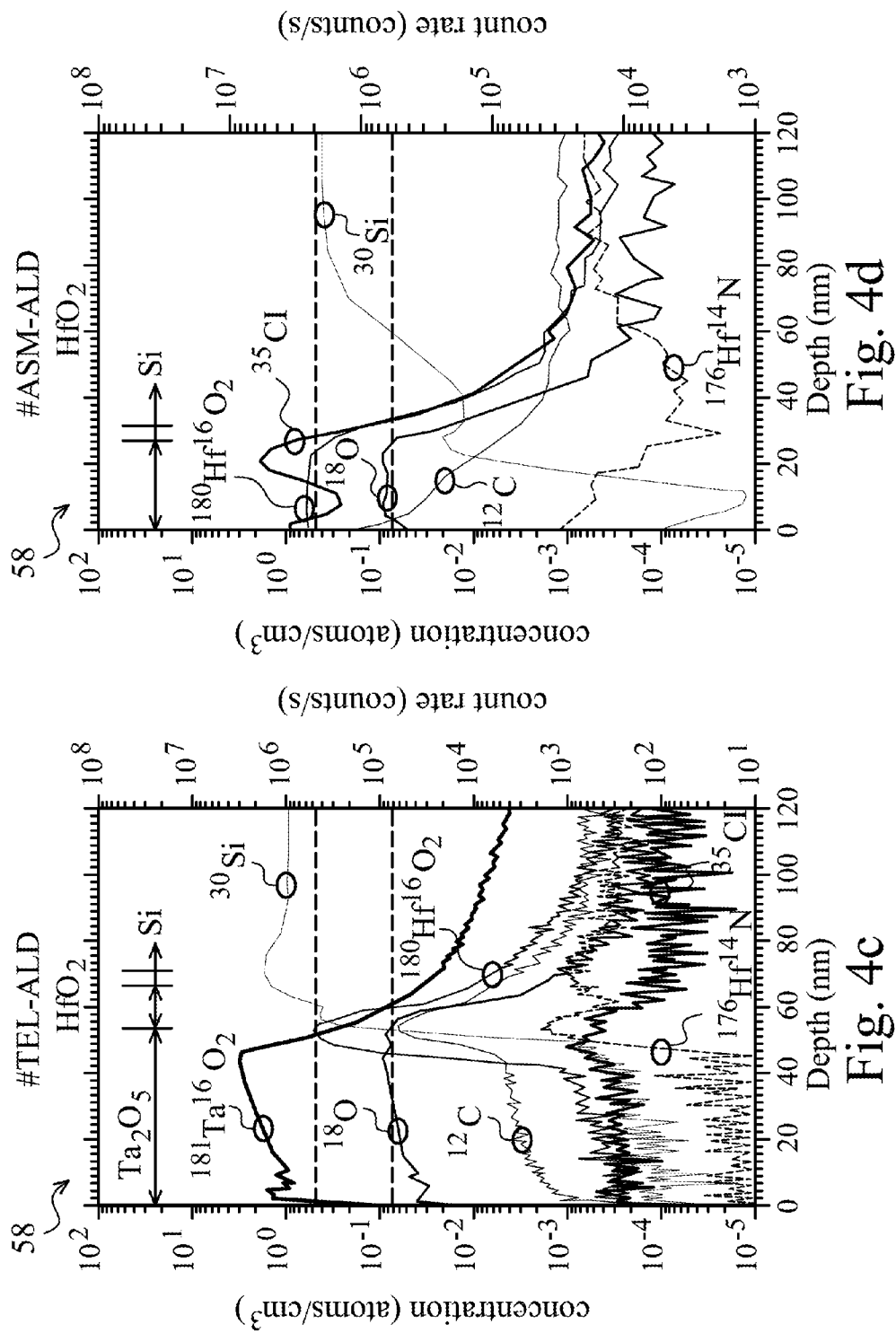

As shown by the chart 44 in FIG. 3, in a first iteration the CIS 10 was formed using an atomic layer deposition (ALD) tool type 46 from Applied Materials (AMAT) and a precursor 48 of Hafnium Tetrachloride and water ($HfCl_4+H_2O$). When the interface 34 of the CIS 10 was subjected to SIMS testing, it was discovered that the concentration of carbon [C] was less than the concentration of oxygen [O] and the concentration of chlorine [Cl] was greater than the concentration of oxygen [O] at the interface 34 as shown in the SIMS profile 58 of FIG. 4a. Referring back to FIG. 3, further testing revealed that the array dark current 52 was 6.4 and the DINU fail rate 54 was 0%, which are both acceptable. However, the occurrence of bubble defects 56 was not good (NG), which was unacceptable.

As shown by the chart 44 in FIG. 3, in a second iteration the CIS 10 was formed using a metal-organic chemical vapor deposition (MOCVD) tool type 46 from Applied Materials (AMAT) and a precursor 48 of Diethylamino Hafnium and Oxygen ($TDEAH+O_2$). When the interface 34 of the CIS 10 was subjected to SIMS testing, it was discovered that the concentration of Carbon [C] was greater than the concentration of Oxygen [O] and the concentration of Chlorine [Cl] was less than the concentration of Oxygen [O] at the interface 34 as shown in the SIMS profile 58 of FIG. 4b. Referring back to FIG. 3, further testing revealed that the array dark current 52 was 147 and the DINU fail rate 54 was 86%, which were both unacceptable. However, the CIS 10 was free of bubble defects 56, which was desirable.

As shown by the chart 44 in FIG. 3, in a third iteration the CIS 10 was formed using an atomic layer deposition (ALD) tool type 46 from Tokyo Electron Limited (TEL) and a precursor 48 of Dimethylamino Hafnium and Ozone ($TDMAH+O_3$). When the interface 34 of the CIS 10 was subjected to SIMS testing, it was discovered that the concentration of Carbon [C] was less than the concentration of Oxygen [O] and the concentration of Chlorine [Cl] was less than the concentration of Oxygen [O] at the interface 34 as shown in the SIMS profile 58 of FIG. 4c. Referring back to FIG. 3, further testing revealed that the array dark current 52 was 6 and the DINU fail rate 54 was 0.4%, which were both acceptable. In addition, the CIS 10 was free of bubble defects 56, which was desirable.

As shown by the chart 44 in FIG. 3, in a fourth iteration the CIS 10 was formed using an atomic layer deposition (ALD) tool type 46 from Advanced Semiconductor Materials International (ASM) and a precursor 48 of Hafnium Tetrachloride and water ($HfCl_4+H_2O$). When the interface 34 of the CIS 10 was subjected to SIMS testing, it was discovered that the concentration of Carbon [C] was less than the concentration of Oxygen [O] and the concentration of Chlorine [Cl] was greater than the concentration of Oxygen [O] at the interface 34 as shown in the SIMS profile 58 of FIG. 4d. Referring back to FIG. 3, further testing revealed that the array dark current 52 was 5.98 and the DINU fail rate 54 was 0%, which are both acceptable. However, the occurrence of bubble defects 56 was not good (NG), which was unacceptable.

From the data and results provided by FIGS. 3-4, it was discovered that the array dark current 52, the DINU fail rate 54, and the bubble defects 56 were collectively acceptable when the concentration of Carbon [C] and the concentration of Chlorine [Cl] were both less than the concentration of Oxygen [O] at the interface 34. In other words, by controlling the relative concentrations of [C], [Cl], and [O] at the interface 34, using the appropriate tool type 46 and deposition process, and/or using the appropriate precursor 48, the CIS 10 had an acceptable dark current 52, DINU fail rate 54, and amount of bubble defects 56.

An embodiment semiconductor device includes a substrate, and an anti-reflective coating disposed upon the substrate, the anti-reflective coating and the substrate forming an interface, a carbon concentration and a chlorine concentration less than an oxygen concentration at the interface.

An embodiment semiconductor device includes a substrate formed from a silicon dioxide overlying silicon, and an anti-reflective formed from hafnium oxide overlying tantalum pentoxide, the hafnium oxide of the anti-reflective coating and the silicon dioxide of the substrate forming an interface, a carbon concentration and a chlorine concentration less than an oxygen concentration at the interface.

An embodiment method of forming a semiconductor device includes forming an anti-reflective coating over a substrate using an atomic layer deposition process and a Dimethylamino Hafnium and Ozone as a precursor, and maintaining a carbon concentration and a chlorine concentration less than an oxygen concentration at an interface between the anti-reflective coating and the substrate.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A semiconductor device, comprising:
   a substrate; and
   an anti-reflective coating disposed upon the substrate, the anti-reflective coating and the substrate forming an interface, a carbon concentration and a chlorine concentration less than an oxygen concentration at the interface.

2. The semiconductor device of claim 1, wherein the substrate is formed from silicon.

3. The semiconductor device of claim 2, wherein the substrate is formed from silicon and a layer of silicon dioxide.

4. The semiconductor device of claim 1, wherein the anti-reflective coating is formed from hafnium oxide.

5. The semiconductor device of claim 1, wherein the anti-reflective coating is formed from hafnium oxide disposed over tantalum pentoxide.

6. The semiconductor device of claim 1, wherein the interface is between about 50 μm to about 60 μm below an upper surface of the anti-reflective coating.

7. The semiconductor device of claim 1, wherein the anti-reflective coating was formed using an atomic layer deposition process.

8. The semiconductor device of claim 1, wherein the anti-reflective coating was formed using Dimethylamino Hafnium and Ozone as a precursor.

9. The semiconductor device of claim 1, wherein a plasma enhanced oxide is disposed over the anti-reflective coating.

10. The semiconductor device of claim 1, wherein a first oxide, a second oxide, and a buffer oxide are disposed over the anti-reflective coating.

11. The semiconductor device of claim 10, wherein the first oxide has a first thickness of about 1100 Angstroms, the second oxide has a second thickness of about 4200 Angstroms, and the buffer oxide has a third thickness of about 500 Angstroms.

12. A semiconductor device, comprising:
a substrate formed from a silicon dioxide overlying silicon; and
an anti-reflective formed from hafnium oxide overlying tantalum pentoxide, the hafnium oxide of the anti-reflective coating and the silicon dioxide of the substrate forming an interface, a carbon concentration and a chlorine concentration less than an oxygen concentration at the interface.

13. The semiconductor device of claim 12, wherein the interface is between about 50 μm to about 60 μm below an upper surface of the anti-reflective coating.

14. The semiconductor device of claim 12, wherein the anti-reflective coating was formed using an atomic layer deposition process.

15. The semiconductor device of claim 12, wherein the anti-reflective coating was formed using Dimethylamino Hafnium and Ozone as a precursor.

16. The semiconductor device of claim 12, wherein at least two oxide layers are disposed over the anti-reflective coating, and wherein the at least two oxide layers support a metal grid.

17. A method of forming a semiconductor device, comprising:
forming an anti-reflective coating over a substrate using an atomic layer deposition process and a Dimethylamino Hafnium and Ozone as a precursor; and
maintaining a carbon concentration and a chlorine concentration less than an oxygen concentration at an interface between the anti-reflective coating and the substrate.

18. The method of claim 17, wherein the substrate is formed from silicon and a layer of silicon dioxide.

19. The method of claim 17, wherein the anti-reflective coating is formed from hafnium oxide disposed over tantalum pentoxide.

20. The method of claim 17, further comprising forming the interface at between about 50 μm to about 60 μm below an upper surface of the anti-reflective coating.

* * * * *